United States Patent [19]
Jaquette et al.

[11] Patent Number: 5,968,149
[45] Date of Patent: Oct. 19, 1999

[54] TANDEM OPERATION OF INPUT/OUTPUT DATA COMPRESSION MODULES

[75] Inventors: Glen Alan Jaquette; Gordon Leon Washburn, both of Tucson, Ariz.

[73] Assignee: International Business Machines Corporation, Armonk, N.Y.

[21] Appl. No.: 09/004,028

[22] Filed: Jan. 7, 1998

[51] Int. Cl.⁶ .................................................. G06F 13/00
[52] U.S. Cl. ................................ 710/68; 710/1; 710/66; 345/202
[58] Field of Search .................................. 710/1, 12, 58, 710/62, 66, 68, 69; 345/202; 370/201, 202

[56] References Cited

U.S. PATENT DOCUMENTS

| | | |
|---|---|---|
| 4,040,049 | 8/1977 | Messerschmitt ........................ 340/347 |
| 4,971,407 | 11/1990 | Hoffman ................................... 341/87 |
| 5,333,277 | 7/1994 | Searls . | |
| 5,410,671 | 4/1995 | Elgamal et al. ......................... 711/202 |
| 5,512,921 | 4/1996 | Mital et al. .............................. 345/202 |
| 5,583,500 | 12/1996 | Allen et al. .............................. 341/107 |
| 5,589,993 | 12/1996 | Naimpally .................................. 386/81 |
| 5,742,930 | 4/1998 | Howitt .................................... 704/502 |
| 5,850,565 | 12/1998 | Wightman ................................ 315/821 |

*Primary Examiner*—Glenn A. Auve
*Assistant Examiner*—Ario Etienne
*Attorney, Agent, or Firm*—John H. Holcombe; Robert M. Sullivan

[57] ABSTRACT

An input/output (I/O) data compression system operates two data compression modules in tandem. A "master" module has an uncompressed data I/O, a data compressor/decompressor, a data flow manager, and a compressed data I/O. An identical "dual" data compression module is also provided. Either module is capable of operating singly to provide compression/decompression between the data I/Os. A "tandem" control causes the master data flow manager to control the compressed data I/O, and causes the dual data flow manager to relinquish control. A dual port "active/slave" control responds to receipt of an input at one of the uncompressed data I/O's, idling the uncompressed data I/O of the module (slave) not receiving the input, and causing the module (active) receiving the input to conduct the input and output of uncompressed data. The input data compressed by the active state module may then be decompressed by the slave state module, and a data comparator, coupled to the decompressed data output, detects whether the data compression of the master is correct.

28 Claims, 6 Drawing Sheets

TANDEM OPERATION OF INPUT/OUTPUT DATA COMPRESSION MODULES

TECHNICAL FIELD

This invention relates to input/output modules for handling digital data, and, more particularly, to modules which employ data compression and decompression.

BACKGROUND OF THE INVENTION

Digital data input/output modules which employ data compression and decompression may be employed for many purposes. One example is the compression and decompression of data as it is transferred between a host computer system and a data storage system, such as magnetic tape or optical disk data storage systems.

It is critical that the data be compressed and transferred at high speed, without stopping, and be correct, without errors, when transferred.

When data is stored on magnetic tape or optical disk, it may be archived for a time such that the original source of the data updates or alters the originating information in the meantime. If, as is typical, the magnetic tape or optical disk is employed as backup, the user will most likely only access the backup data if the primary storage has failed and the user is trying to rebuild it. Thus, should the stored data have uncorrectable errors which cannot be ascertained from the context, and the original data is changed or lost, there is no way to rebuild the data.

A potential source of error for the archived data is the data compression. As the result, certain highly robust systems may employ a special circuit for checking the accuracy of the data compression "on-the-fly" so that the errors can be corrected before the data is archived. One special circuit for checking the accuracy of the data compression is illustrated in coassigned U.S. Pat. No. 5,608,396, Cheng et al., issued Mar. 5, 1997, which employs a custom cell known as a Content Addressable Memory (CAM) and a software implementation to verify compressed data on the fly by simultaneous decode and cyclic redundancy check (CRC) comparison with source data. Error correction control codes can be inserted or the transfer interrupted if an error is found. Also, decompression on the fly requires full duplex operation with one piece of logic compressing, and another piece of logic decompressing, requiring additional logic. Such special circuitry is expensive and therefore can only be used on a few "high end" archiving storage systems.

In high end systems, a plurality of hosts are often attached to a plurality of drives. Thus, if a dual port system is provided, throughput can be greatly enhanced if, for example, in addition to Host 1 tranferring data with Drive 3, there can be a separate transfer between Host 2 and Drive 1.

In addition, in some environments, it is critical that a host does not lose access to a storage device even if one of the transmission paths fails due to a hardware failure or a hang condition. Thus, one approach is a dual port system providing dual paths to storage, so that if the transmission path to one port fails, the other port may still be available to gain access to the data storage drive.

Again, the extra logic and communication circuitry is expensive and can only be used on a few data storage systems that warrant the expense.

Low cost systems also require input/output modules with data compression/decompression in order to archive large amounts of data with a reasonable use of storage media.

SUMMARY OF THE INVENTION

It is an object of the present invention to employ the same input/output data compression module for both low cost input/output systems and higher cost systems, thereby tending to reduce the cost of the higher cost input/output systems.

Another object of the present invention is to provide an input/output module with data compression/decompression which is capable of both operating as a dual port system and which provides detection of compression errors in the data before it is stored and archived.

Disclosed is a data compression system for operating two data compression modules in tandem. A "master" data compression module is provided having an uncompressed data input/output, a data compressor/decompressor, a data flow manager, and a compressed data input/output, the module operable as an entity to provide data compression/decompression between the data input/outputs. A "dual" data compression module is provided having an uncompressed data input/output, a data compressor/decompressor, a data flow manager, and a compressed data input/output, the module also operable as an entity to provide data compression/decompression between the data input/outputs. Either data compression module may be employed singly for data compression/decompression and input/output. In one embodiment, a memory module is provided having a data flow path coupled to the data flow managers of the master and of the dual data compression modules, and a "tandem" control is coupled to the master data compression module to cause the master data flow manager to control the memory module data flow path, and coupled to the dual data compression module to cause the dual data flow manager to relinquish control of the data flow manager data flow path.

In an alternative embodiment, data compression modules are arranged in tandem, with the data flow managers directly coupled betweeen the data compressor/decompressors and the module compressed data input/outputs. The data path is coupled between the modules at the compressed data input/outputs. A separate data flow and device I/O module is connected to the data flow path between the modules.

An "active/slave state" control coupled to the uncompressed data input/outputs provides a dual port input/output. The active/slave state control is also coupled to the the master and the dual data compression modules, responsive to receipt an input at one of the uncompressed data input/outputs to place the receiving data compression module in an "active state", to idle the uncompressed data input/output of the one of the data compression modules (slave) not receiving the input, and to cause the active state data compression module to provide data compression/decompression of data from the data inputs.

The compressed data may then be decompressed by the slave state compressor/decompressor, and a data comparator, coupled to the decompressed data output, detects whether the data compression of the active state compressor/decompressor is correct. The data comparator may include a cyclic redundancy code (CRC) generator in each module coupled to the uncompressed data input of the compressor/decompressor for providing a CRC of the active state module uncompressed data and coupled to the decompressed data output of the compressor/decompressor for providing a CRC of the slave state module decompressed data; and CRC comparator coupled to the CRC generators for comparing the uncompressed data and decompressed data CRCs.

A feature of the present invention is that use of the same module both for the low end and in tandem for the high end brings down the module cost through volume production.

For a fuller understanding of the present invention, reference should be made to the following detailed description taken in conjunction with the accompanying drawings.

DETAILED DESCRIPTION OF THE INVENTION

Figure 1:
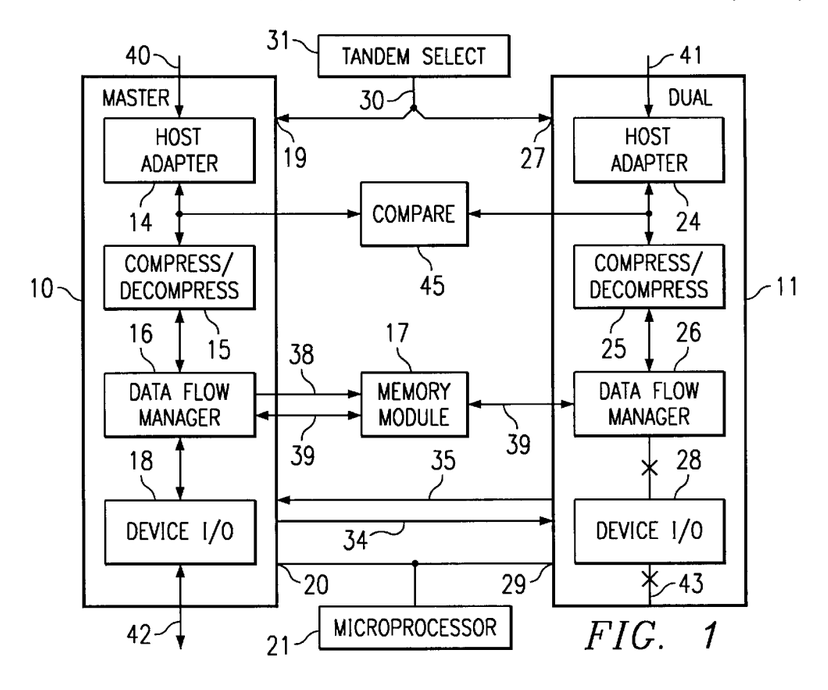
FIG. 1 is a block diagram of input/output modules arranged in tandem in accordance with the present invention.

Referring to FIG. 1, one embodiment of the present invention is shown, with two exemplary input/output data compression modules 10 and 11. One or more of the components shown as separate, such as memory module 17 or compare 45, may be located on one or both of the modules. However, the greatest cost savings occur if both data compression modules are identical, and the memory module 17 is external. The input/output data compression module 10 includes a host adapter 14 which receives data and commands from a host digital data processor and supplies the data to a data compressor/decompressor 15. The data compressor/decompressor 15 compresses uncompressed data from the host adapter 14 and supplies the compressed data to a data flow manager 16. The data flow manager 16 may temporarily store data in a memory module 17, and, when the data storage device is ready to receive data, the data flow manager may access the data in the memory module 17. The data flow manager transmits the data to a device input/output 18 to an attached device at port 42, such as an optical or tape data storage drive. The memory module 17 may comprise any suitable memory device or array, for example, a dynamic random access memory (DRAM).

Conversely, the attached device at port 42 may supply compressed data at the device input/output 18, which supplies the compressed data to data flow manager 16. The data flow manager may temporarily store the received compressed data in the memory module 17, later accessing the data. The data flow manager supplies the compressed data to compressor/decompressor 15. The compressor/decompressor 15 decompresses the data and supplies the data to host adapter 14. Host adapter 14 provides an interface to an attached host, such as a computer system, and transmits the decompressed data to the host.

The input/output data compression module 10 is capable of providing an input/output and data compression and decompression between a host and an attached device.

Additionally, in accordance with an embodiment of the present invention, input/output data compression module 10 is provided with a tandem select control input 19, which may be an input pin. On module 10, the tandem select control input 19 is held high and affects the data flow manager 16 to assume control over the data path of the memory module 17 including initialization and refresh of the memory. The input/output data compression module 10 is called the "master" when the tandem select control input 19 is high.

In accordance with an embodiment of the present invention, the input/output data compression module 10 is provided with a microprocessor input/output 20 connected to a microprocessor 21. In the typical case, an attached microprocessor receives status information from the module 10 and provides commands and determines headers, etc., for data stored by the module.

The second input/output data compression module 11 is preferably identical to the module 10. From a cost advantage point of view, if the input/output data compression module circuits are identical, and two are used in high end applications, the volumes are doubled, and, if the same module is used singly in low end applications, volumes are greatly increased, reducing costs. Module 11 also includes a host adapter 24 which receives data and commands from a host digital data processor and supplies the data to a data compressor/decompressor 25. The data compressor/decompressor 25 compresses uncompressed data from the host adapter 24 and supplies the compressed data to a data flow manager 26. The data flow manager 26 may temporarily store data in the memory module 17 and, when the data storage device is ready to receive data, the data flow manager may access the data in the memory module 17. The data flow manager transmits the data to a device input/output 28 to an attached device at port 43, such as an optical or tape data storage drive. Conversely, the attached device at port 43 may supply compressed data at the device input/output 28, which supplies the compressed data to data flow manager 26. The data flow manager may temporarily store the received compressed data in the memory module 17, later accessing the data. The data flow manager supplies the compressed data to compressor/decompressor 25. The compressor/decompressor 25 decompresses the data and supplies the data to host adapter 24. Host adapter 24 provides an interface to an attached host, such as a computer system, and transmits the decompressed data to the host.

In accordance with an embodiment of the present invention, input/output data compression module 11 is also provided with a tandem select control input 27, which may be an input pin. On module 11, the tandem select control input 27 is held low and affects the data flow manager 26 to relinquish control over the data path of the memory module 17 including initialization and refresh of the memory. The input/output data compression module 11 is called the "dual" when the tandem select control input 27 is low.

Additionally, in accordance with an embodiment of the present invention, when the input 27 is low, the device input/output 28 of module 11 is idled. Thus, when in the tandem master/dual arrangement, the attached device is only attached to the device input/output 18 of master module 10, and all data handling with respect to the device is conducted by the master module 10.

The input/output data compression module 11, when in tandem mode, therefore provides an input/output and data compression and decompression between a host and an attached device, using the device input/output of module 10, as will be explained. When not in tandem mode, module 11 is capable of providing input/output and data compression/decompression, as described above.

In accordance with an embodiment of the present invention, the input/output data compression module 11 is also provided with a microprocessor input/output 29. In the typical case, an attached microprocessor receives status information from the module 11 and provides commands and determines headers, etc., for the module. When in tandem mode, the microprocessor input/output 29 will be connected to the same microprocessor 21 as the microprocessor input/output 20 of module 10.

Thus, each of the input/output data compression modules 10 and 11 is capable of independent operation as a single module, for low end systems, which provides data compression of data transmitted from a host to an attached device, and provides data decompression of data received from the attached device and provides the decompressed data to the host.

There is a second distinction other than the master/slave distinction between the modules 10 and 11. In accordance with an embodiment of the present invention, each module serves as a port attached to the host. Thus, the master and dual modules provide dual port access to the attached device via device input/output 18.

The second distinction, in accordance with an embodiment of the present invention, is swapped between the modules. When one of the modules receives a Write or a Read command from the host at its host adapter 14 or 24, the command is followed by a data phase. Although there are two host adapters, only one can be used to attach to the host to transmit data to or from a given device, as will be explained. Thus, there is only one data phase (a SCSI "small computer system interface" term) at a time from the host regarding a given device.

The module receiving the Write or the Read command is "data phase active", and the other module, not receiving the command, is "data phase slave". In one example, the interpretation of the command and the designation of which module is in the active state and which is in the slave state, is under the control of the microprocessor attached to both modules at connections 20 and 29, respectively. Alternatively, the arbitration which determines which module 10 or 11 is in which state, may be under the control of one or two I/O pins, as will be described. Either module may be the active or the slave. If one module is in one state, the other must be in the opposite state.

Thus, the master module 10 may receive the Write or Read command and be in the active state, and dual module 11 is in the slave state. Alternatively, the dual module 11 may receive the Write or Read command and be in the active state, and master module 10 is in the slave state. If no command is received, both modules are in an "inactive" state, and this is the state that both modules power on to.

As will be explained, the compression/decompression circuit 15 or 25 of the module in the slave state will be used to perform a check of the compression circuitry of the module in the active state when that module is compressing data as part of a Write operation.

Two I/O pins for controlling the arbitration between states is the easiest conceptually and is the most fool proof, and are illustrated as master data phase pin 34 and dual data phase pin 35. Both pins power up to the low or inactive state. If the master module 10 receives a Write or a Read command, it is in the active state and brings up the master data phase pin 34, which alerts the dual module 11 that it must operate in the slave state. Similarly, if the dual module 11 receives a Write or a Read command, it is in the active state and brings up the dual data phase pin 35, which alerts the master module 10 that it must operate in the slave state. When the input command operation is completed, the module 10 or 11 which is in the active state lowers its respective pin 34 or 35 and goes to the inactive state, as does the other module. If the module which is in the slave state receives a Write or read command while the other module is active, this is an error condition, and this command either must be held off until the other port being serviced is completed, or must be rejected and an error condition reported.

The master label for module 10 relates to its status relative to the memory module 17. Specifically, the data flow manager 16 of the master module 10 controls 38 the operation of data path 39 and the memory module 17 totally, even when it is in the slave state. Also, data is always transmitted to the device I/O 18 of the module which is in the tandem mode master state.

First, consider a series of Write commands from a host at either port 40 or 41 for transmitting packets of data to a device attached at device port 42 from device I/O 18. After the active/slave pin has been set, the data is received by the active host adapter 14 or 24 and is compressed by compressor/decompressor 15 or 25. The master data flow manager 16 then supplies, or allows dual data flow manager 26 to supply, the compressed data to the memory module 17 and continually refreshes the memory module as needed. Then, the master data flow manager accesses the data in the memory module 17 and transmits the data to the device I/O 18 of the master, which supplies the data to the output port 42. Next, consider a series of Read commands from a host at either port 40 or 41 for reading packets of data from the device attached at device port 42. After the active/slave pin has been set, the data is received by the master device I/O 18 and the master data flow manager 16 supplies the compressed data to the memory module 17 and again continually refreshes the memory module as needed. Then, the master data flow manager 16 either accesses the data in the memory module 17, if module 10 is in the active state, or allows access to the data by the dual module 11, if it is in the active state. The module in the active state supplies the data to the respective data compressor/decompressor 15 or 25 to be decompressed and the decompressed data is supplied to the host adapter 14 or 24 which received the Read command.

Another aspect of the present invention is to verify the compression of the compressor/decompressors 15 and 25. In one embodiment of the present invention, a comparator 45 is provided to make the comparison. Comparator 45 may be implemented as a component on either module 10 or module 11, as components on both modules, or as components on or shared with a different module. The comparison is of the uncompressed data to the data after it has been compressed and then decompressed. The uncompressed data of the active host adapter 14 or 24, or a derivative or indicator of the data, is supplied to the comparator 45, and the data is compressed by the active compressor/decompressor 15 or 25. The compressed data is monitored or "snooped" from the data path of the memory module 17 by the slave data flow manager 16 or 26 and supplied to the slave compressor/decompressor 15 or 25 and is decompressed. The decompressed data, or a derivative or indicator of the data, is supplied to the comparator 45 and is compared by the comparator to the uncompressed data. If the comparator 45 indicates that the uncompressed data and decompressed data compare identically, the compression is deemed correct. If the comparator indicates an error in the comparison, an error is posted and an error recovery procedure may be initiated, such as repeating the data transfer from the host attached to the active host adapter.

Master data flow manager 16 controls the data transfer of the compressed data from the memory module to both the device I/O 18 and to the slave compressor/decompressor 15 or 25 for decompression, and the data compression/ decompression module in the slave state monitors or "snoops" the compressed data on its own. This may be accomplished by time slice multiplexing, together with the continued temporary storage of new data in the memory module. Time slices may be allocated to input of data into the memory module, reading of data from the memory module, and refresh. Additional time slices may be allocated to the provision of any error detection within the memory module.

If the dual memory module 11 is in the active state, the master data flow manager 16 allows the slave data flow manager 26 to address the memory module and write the compressed data from the compressor 25 to the memory module 17 for subsequent access by the master data flow manager 16 to be supplied to the master compressor/ decompressor 15 for decompression and comparison to the uncompressed data and to be supplied to the device I/O 16.

Specifically, if the dual compression module 11 is in the active state, the master data flow manager 16 goes to a "tri-state" mode in a time slice allocated to the storing of data to the memory module 17, allowing the dual data flow manager 26 to address the memory module. The master accesses the data by "snooping" the bus for transmission to the slave (master) compressor/decompressor 15 for decompression and comparison to the uncompressed data by comparator 45.

The slave state compression module, whether master or dual, "snoops" the bus and receives the data as the active module writes it out, since the data flow managers have both a receiver and tri-statable output. When in "tri-state" the output drivers of the module in the slave state are disabled, but the receivers of the module in the slave state (connected to the same pins) can still read the value driven onto the bus by the drivers of the module in the active state.

Thus, the module receiving the Write command from the host becomes the active module and receives the data from the host, providing the uncompressed data to the comparator 45 and to the active compressor/decompressor for compression. The compressed data is supplied by the active data flow manager to the memory module 17. The compressed data is then monitored and supplied to the slave compressor/ decompressor for decompression and comparison to the uncompressed data by the comparator 45. The compressed data is also supplied from the memory module to the master device I/O 18.

Figure 2:
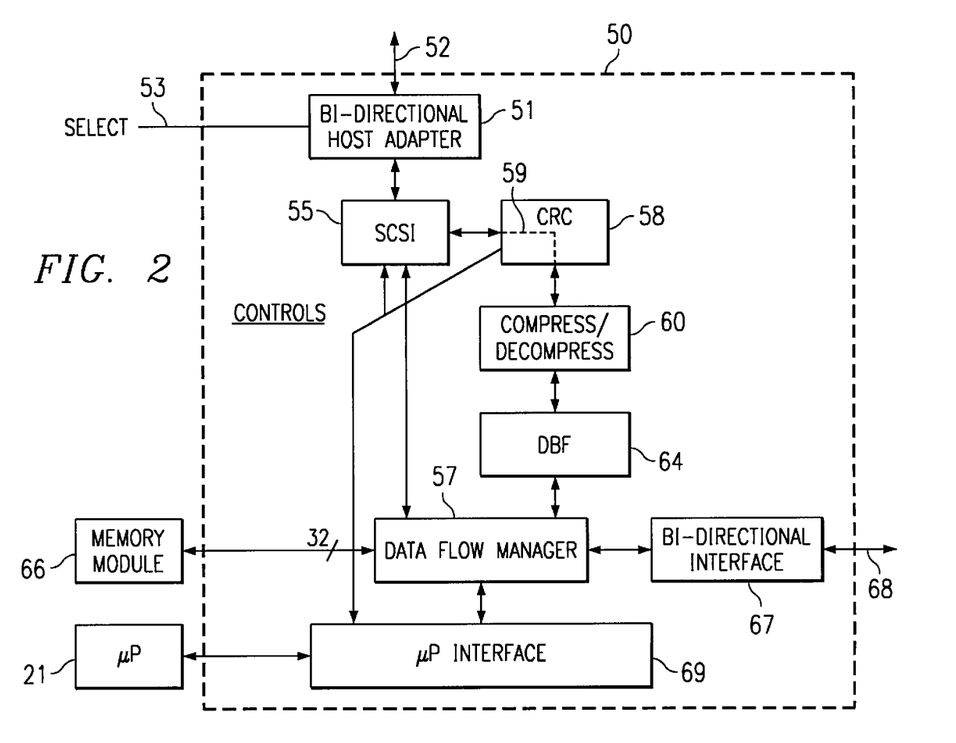
FIG. 2 is a block diagram of an example of one of the input/output modules of FIG. 1.

FIG. 2 illustrates an example of one of the input/output modules of FIG. 1 for a SCSI ("small computer systems interface") interface.

In module 50, a bi-directional host adapter 51 is connected to a host port 52. In the single module environment, there is only a master module, and no dual module, operating as though tandem select pin 52 were high. A SCSI controller 55 is connected to the host adapter 50 to decode the input commands from the host, transmitting the data between the host adapter 50 and through a cyclic redundancy check (CRC) circuit 58. As shown, the CRC circuit of the module in the active state can just generate CRC bytes, in which case the CRC circuit of the module in the slave state is used to generate the CRC on the bytes coming from the circuit decompressing the compressed data stream, which should be the same. Or the CRC circuit of the module in the active state can append the CRC bytes to end of the data unit being compressed (e.g. a record), in which case the CRC circuit of the module in the slave state will process all of the bytes which are decompressed, which include the appended CRC bytes, and having done so the residue left in the registers of the CRC circuit should be zero. In the latter case the Valid line indicates that the last four bytes transferred to the host adapter are invalid (stripping the appended CRC bytes off). The appending of CRC can only be performed on recording formats which call out this type of record protection, so it is known a priori on reading a record that the last four bytes are to be treated as CRC, not data bytes. The CRC circuit 58 is employed in the tandem arrangement for providing information for the uncompressed to decompressed data comparison, as will be described.

The same or other CRC circuits may be utilized in some formats for appending CRC's to the data, but do not form part of the present invention.

The data from the CRC 58 is provided to a compressor/ decompressor 60, where it is compressed and supplied to a data block formatter 64 which formats the data into blocks arranged for storage on the tape or optical disk media. The formatted data is supplied to the data flow manager 57 for temporary storage in a memory module (e.g., DRAM) 66. The data flow manager 57 writes the compressed data into the DRAM 66 and later accesses the data for transmission to a bi-directional device interface 67 for an attached device at a device port 68. A microprocessor interface 69 connects microprocessor 21 to the SCSI controller 55, to the data flow manager 57, and to the CRC circuit 58 for reading of the CRC, as will be explained. Data from the device port 68 is temporarily stored by the data flow manager 57 in the DRAM 66 and later accessed and supplied to the data block formatter 64 where the data is deformatted from the storage format and arranged in a format for decompression and transmission to the host at host port 51. The data is then supplied to the compressor/decompressor 60 for decompression and supplied through the CRC to the bi-directional host adapter 50 to the host port 51.

FIGS. 3–7 illustrate the operation of two of the input/ output data compression modules of FIG. 2 arranged in tandem in accordance with an embodiment of the invention. Similar numerals are therefore used to describe the modules in FIG. 3.

Figure 3:
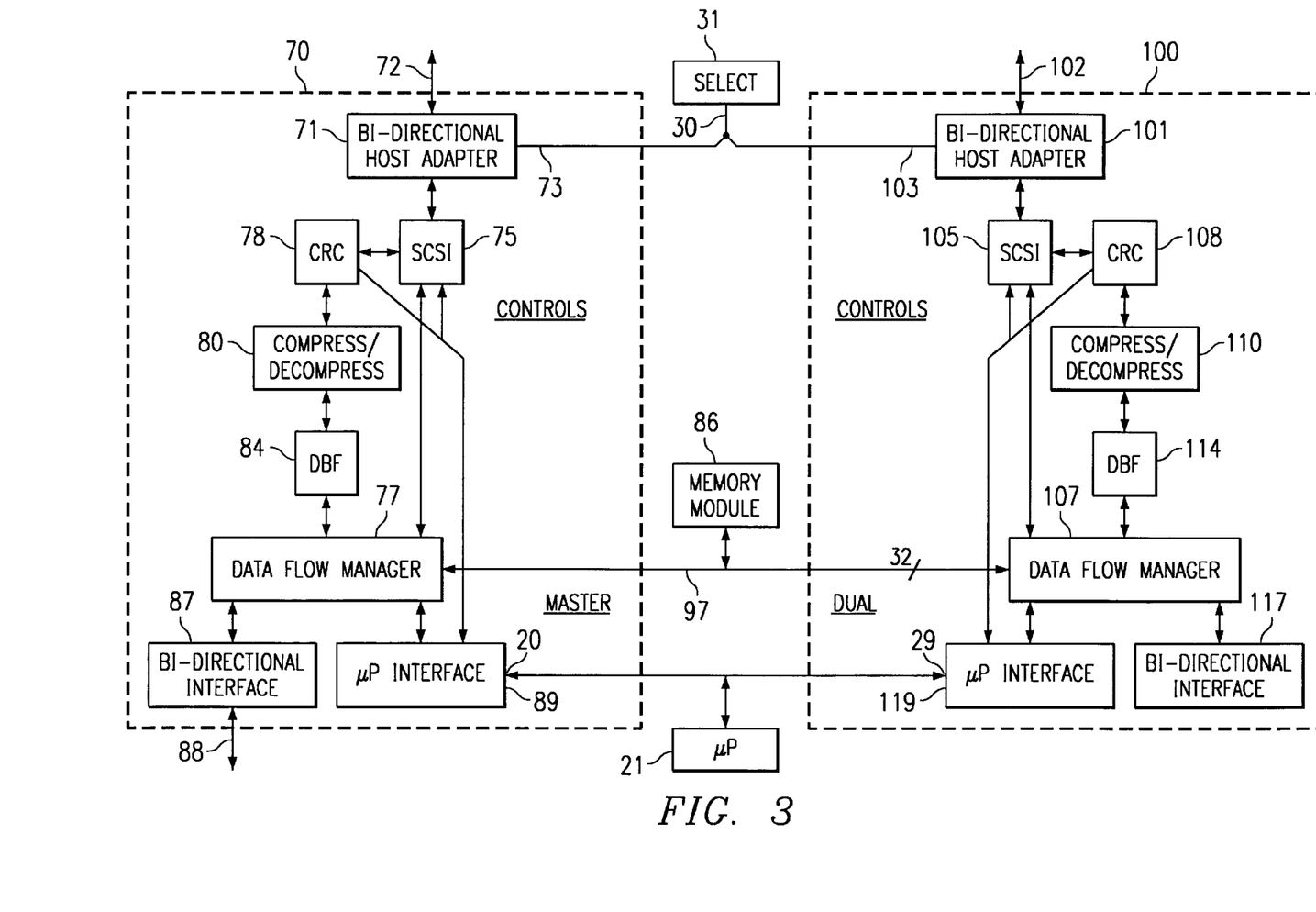
FIG. 3 is a block diagram of two of the exemplary input/output modules of FIG. 2 arranged in tandem in accordance with the present invention.

In FIG. 3, module 70 is the master module as controlled by tandem select pin 73. A bi-directional host adapter 71 is connected to a host port 72 and to the tandem select pin 73. A SCSI controller 75 is connected to the host adapter 71 to decode the input commands from the host, and controls a data flow manager 77 and transmits the data between the host adapter 71 and a cyclic redundancy check (CRC) circuit 78.

In accordance with the present invention, the CRC circuit 78 is employed in the tandem arrangement for providing information for the uncompressed to decompressed data comparison, as will be explained.

The CRC 78 is connected to a compressor/decompressor 80, and the compressor/decompressor is connected to a data block formatter 84. The data block formatter formats the data into blocks arranged for storage on the tape or optical disk media or arranges the formatted data for decompression. The data block formatter is connected to the data flow manager 77 which temporarily stores data in a memory module (e.g., DRAM) 86. The data flow manager 77 writes the compressed data on data path 97 into the DRAM 86 for later access. The data flow manager 77 is connected to a bi-directional device interface 87 for communication with an attached device at a device port 88. A microprocessor interface 89 connects microprocessor 21 to the SCSI controller 75, to the data flow manager 77, and to the CRC circuit 78 for reading of the CRC, as will be explained.

Module 100 is the dual module as controlled by tandem select pin 103. A bi-directional host adapter 101 is connected to a host port 102 and to the tandem select pin 103. A SCSI controller 105 is connected to the host adapter 101 to decode the input commands from the host, and controls a data flow manager 107 and transmits the data between the host adapter 101 and a cyclic redundancy check (CRC) circuit 108.

In accordance with the present invention, the CRC circuit 108 is employed in the tandem arrangement for providing information for the uncompressed to decompressed data comparison, as will be explained.

The CRC 108 is connected to a compressor/decompressor 110, and the compressor/decompressor is connected to a data block formatter 114. The data block formatter formats the data into blocks arranged for storage on the tape or optical disk media or arranges the formatted data for decompression. The data block formatter is connected to the data flow manager 107 which temporarily stores data in the memory module (e.g., DRAM) 86. The data flow manager 107 writes the compressed data into the DRAM 86 and later accesses the data, but, if in tandem mode, writes the data when allowed by the master. The data flow manager 107 is connected to a bi-directional device interface 117, which is idled in the tandem mode. Rather, all communication with an attached device is conducted by the master module at device port 88. A microprocessor interface 119 connects microprocessor 21 to the SCSI controller 105, to the data flow manager 107, and to the CRC circuit 108 for reading of the CRC, as will be explained.

The tandem select control 31 provides a high level to the tandem select pin 73 and a low level on the tandem select pin 103 to designate module 70 as the master module and to designate module 100 as the dual module.

When a command is received at either port 72 or port 102, the respective SCSI controller 75 or 105 receives the command and provides the indication whether the command is a Read or Write command (as opposed to another type of command). If the command is a Read or a Write, the SCSI controller provides the indication to the microprocessor 21, which designates the receiving module as the active module and the other as the slave, and operates the SCSI controllers 75 and 105 and data flow managers 77 and 107 accordingly.

Alternatively, the SCSI controller may be provided with microcode to make the active/slave designations.

Figure 5:
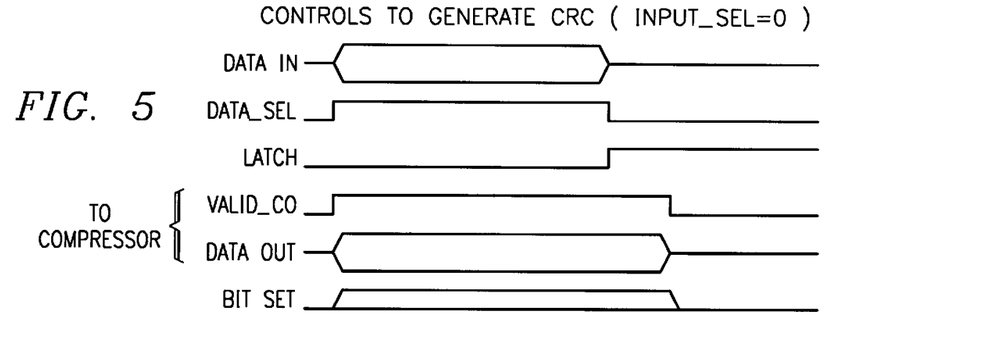
FIGS. 5 and 6 are signal diagrams of the operation of the CRC generator and checker of FIG. 4.
Figure 6:
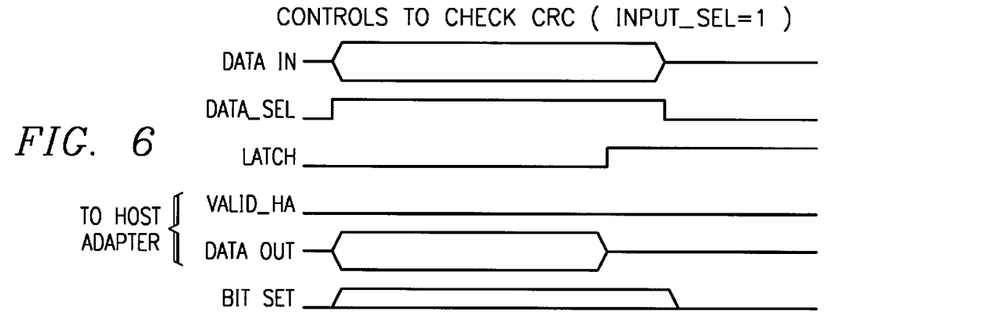

If the command is a Write command, the uncompressed data to be written to the data storage device is supplied to the active CRC 78 or 108. An example of the CRC circuit 78 or 108 is illustrated in FIG. 4, and the data flow is illustrated in FIGS. 5 and 6.

The CRC circuit serves, respectively, in the active module to generate a CRC character for the received uncompressed data (and can optionally append CRC bytes per the above), which character will be used as the basis for comparison to the decompressed data, and, in the slave module to generate a CRC on the data that was compressed by the active module then decompressed by the slave module. The slave CRC circuit may either calculate the CRC character based on the data and provide the CRC character to the microprocessor for comparison, or may calculate the CRC based on the data and the active CRC, so that the resultant CRC cancels the active CRC bits and produces an all zero CRC if the compression was correct.

Figure 4:
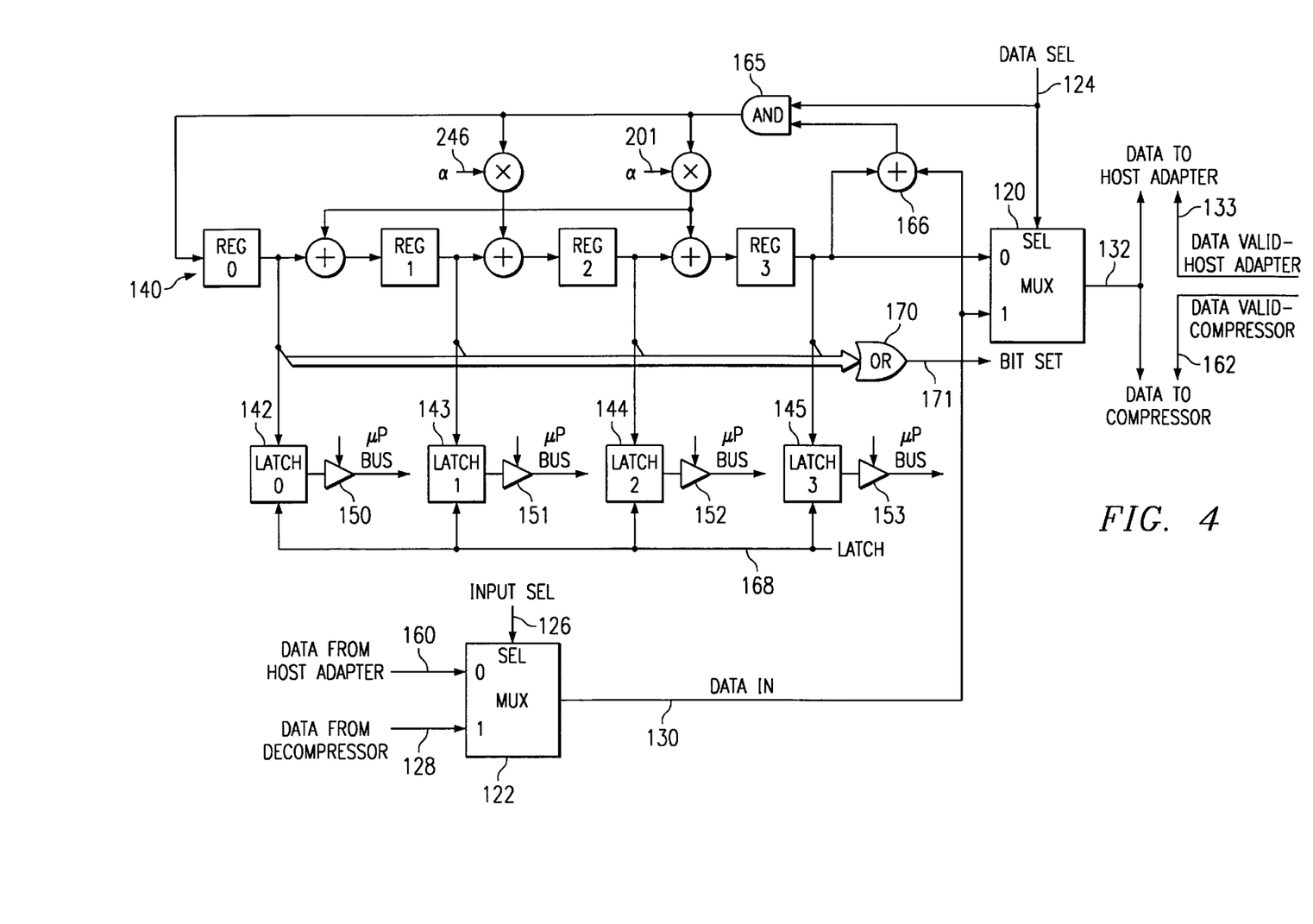
FIG. 4 is a block diagram of the cyclic redundancy check (CRC) generator and checker of the input/output modules of FIG. 3.

Referring to FIG. 4, the CRC circuit is arranged to both be a CRC generator and a CRC checker and to pass the compressed or decompressed data without generation or checking of a CRC character by the control of multiplexors 120 and 122. The simplest case is the transmission of decompressed data from the device port 87 to the host port 72 or 102. Both data select 124 (DATA_SEL in microcode) and input select 126 (INPUT_SEL) are high (1) so that data from the decompressor 80 or 110 (FIG. 3) on input 128 is gated by multiplexor 122 on bus 130 and by multiplexor 120 to bus 132, and accompanied by a data valid (VALID_HA) signal on line 133 to the host adapter 71 or 101 (FIG. 3) to signal the bi-direction host adapter that the data on bus 132 is valid for the host adapter.

A cyclic redundancy calculator (CRC) 140 is one of many possible calculations that may be performed on the uncompressed data to allow comparison with the decompressed data. One example is a Reed-Solomon code which is particularly advantageous for performing the calculation, requiring the storage of only a few bytes of data. Reed-Solomon CRC generation and syndrome calculation are well known. A description of Reed-Solomon generation and syndrome calculation may be found, for example, in "Error Control Coding: Fundamentals and Applications", Lin and Costello, Prentice-Hall, Inc., 1983, pp. 171–176. Many specific Reed-Solomon arrangements and polynomials may be used to implement the CRC calculation employed in the present invention.

The example illustrated in FIG. 4 is for a four byte CRC for a byte wide data path based on a palindrome polynomial, and circuit 140 has a four byte linear feedback shift register with two alpha terms for generating the four CRC bytes. Each register of circuit 140 is attached to a corresponding one of byte wide latches 142–145. This allows latching of the CRC which is generated by the input uncompressed data before compression to be checked after compression and decompression. The latches 142–145 are attached to tri-state buffers 150–153 which can drive onto the microprocessor interface 89 or 119 (FIG. 3) to allow the CRC bytes to be read by the microprocessor.

The generation of the CRC characters is illustrated with reference to FIGS. 4 and 5. For generation of the CRC characters from the uncompressed input from the host adapter, all the data is passed in from the host adapter 71 or 101 (FIG. 3) on bus 160 by multiplexor 122 with an input select 126 (INPUT_SEL) signal (0) and with data select 124 (DATA_SEL) high (1). The data is passed through multiplexor 120 to the compressor with a data valid signal on line 162 (VALID_CO). The data select signal also operates gate 165 so that the data and feedback of the CRC calculator at OR 166 are supplied to the CRC circuit 140. After all the data has passed through the CRC circuit and the CRC characters have been generated, a latch signal 168 (LATCH) latches the contents of the registers as data select 124 (DATA_SEL) is brought low (0). During the next four cycles, the CRC is output on bus 132 while data valid for the compressor remains high. Thus, the multiplexor 120 gates the CRC characters and appends them to the previous data. The CRC bytes are still available for the microprocessor and can be read at any time before the next record is received. This is the action taken when the CRC generator is the "active" module during receipt of data from the host.

If the CRC generator is the "slave" module during receipt of data from the host, the CRC circuit 140 checks the decompressed data to determine whether the compression by the "active" module was correct. When the slave CRC circuit is operated as a checker, the controls are run differently, as illustrated with reference to FIGS. 4 and 6. In this case, the incoming data bytes from the decompressor on bus 128 include the CRC bytes and they are all input with input select 126 (INPUT_SEL) and data select 124

(DATA_SEL) high. The decompressed data is transmitted on bus 130 and bus 132, but no data valid signal 133 or 162 VALID_HA) is provided. Thus, the data is only supplied via OR 166 and gated by AND 165 to the CRC circuit 140 for checking of the decompressed data CRC against the uncompressed CRC for the same data. The contents of the CRC generator registers from the data can be captured by the latches 142–145 at the transition between the original data bytes and CRC. This captured CRC on the slave module can be compared by the microprocessor to the original CRC captured on the active module. Alternatively, once the four CRC bytes have been clocked through the CRC circuit 140, the CRC bytes passed in should exactly cancel the bytes in the registers, leaving the residue to be zero. The check for zero can be performed via OR gate 170 and line 171 (BIT SET), which may be connected to the microprocessor interface 89 or 119 (FIG. 3). If the output of the OR is high, one bit has been set, and there is an error. Thus, the microprocessor may read this line to know if the CRC checker has received a complete entity which has the appropriate Galois Field zeros.

This is not foolproof since a short which inputs all 0's to the circuit could generate this result. Thus, the comparison of the latched CRC values themselves is a better check.

In addition, other means of comparison or calculation of derivatives of the data, such as direct comparison of the data or portions of the data, may be utilized.

Figure 7A:
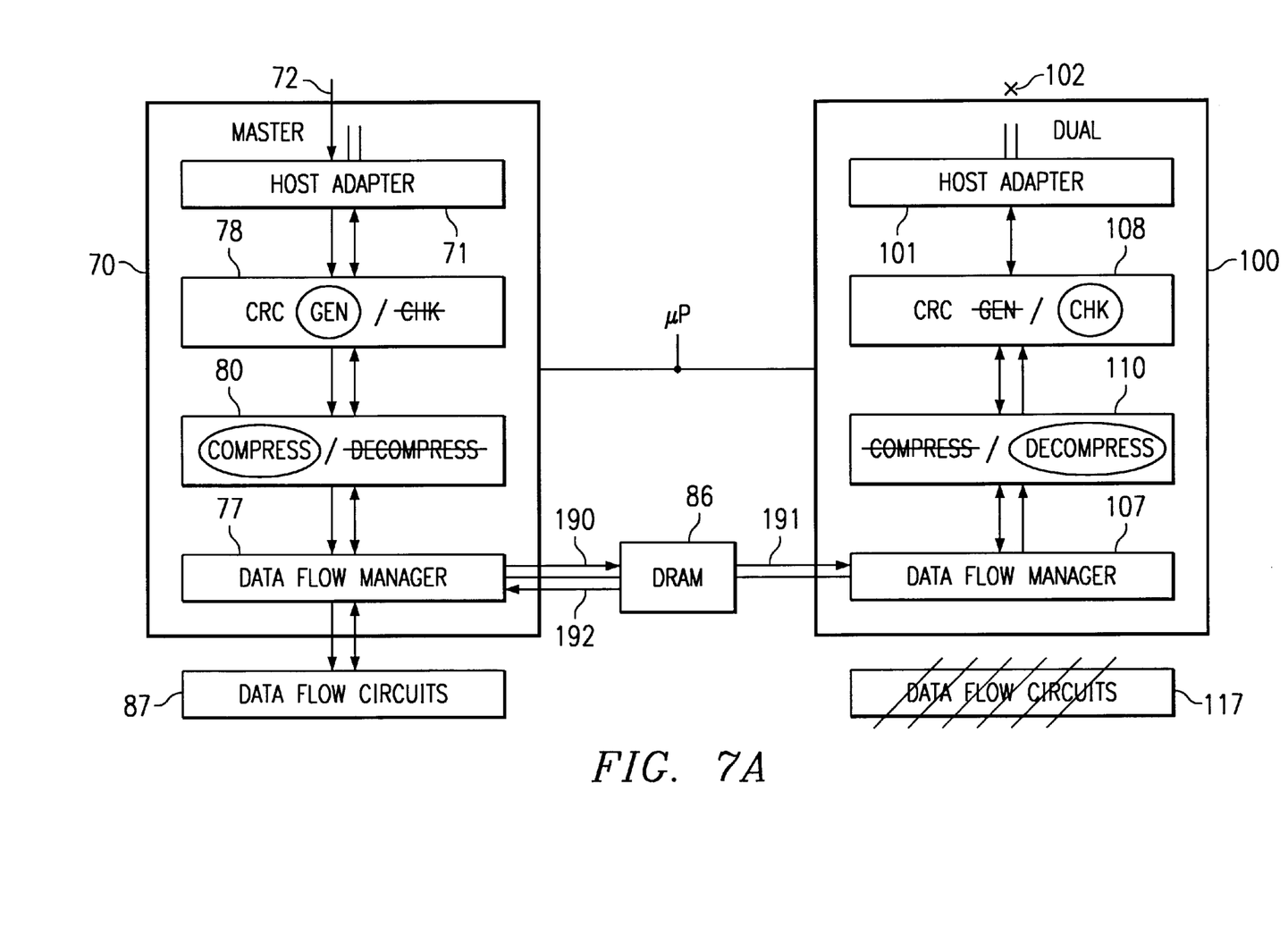
FIGS. 7A and 7B are schematic illustration of the data flow of the tandem input/output modules of FIG. 3.
Figure 7B:
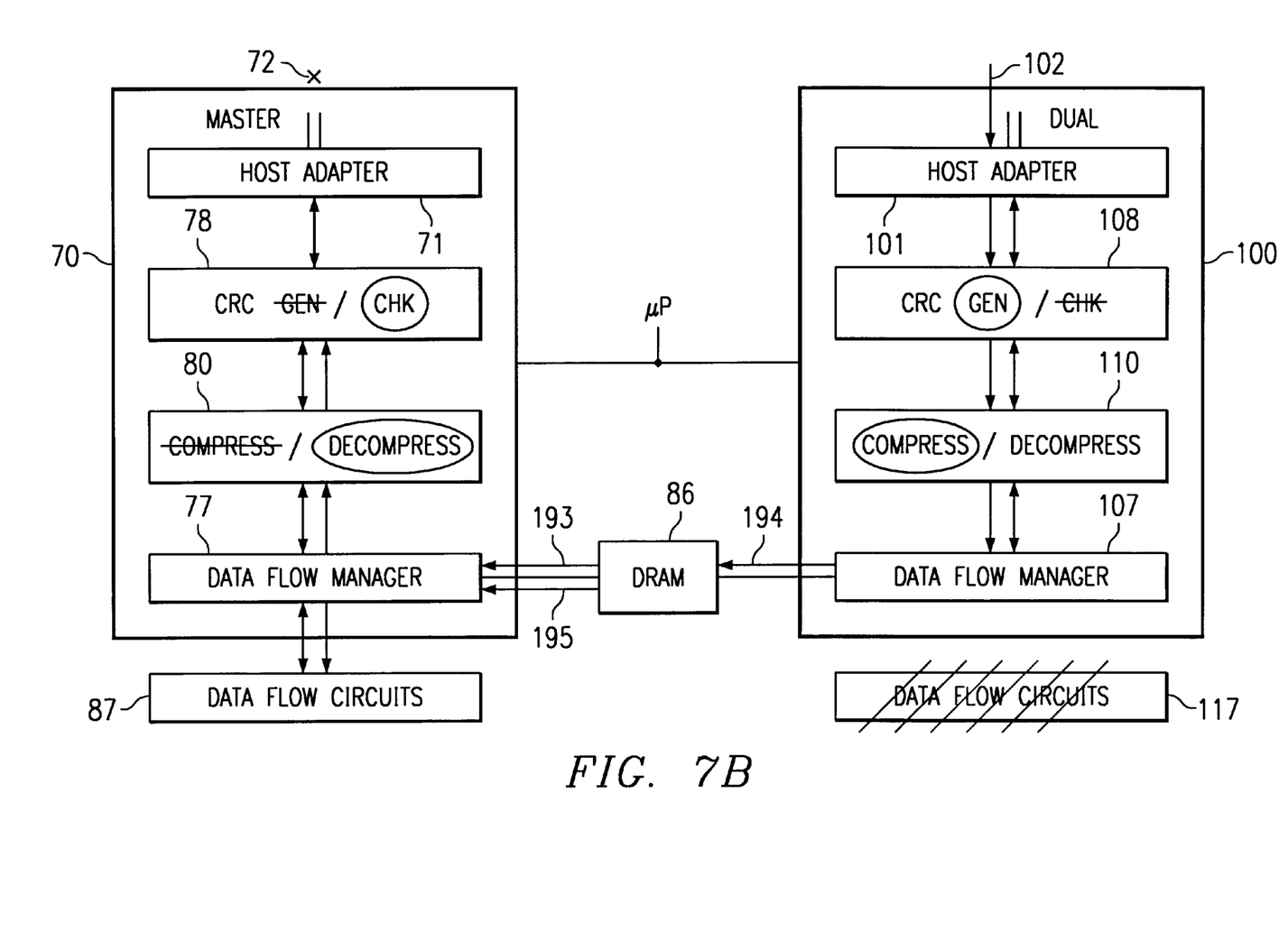

FIGS. 7A and 7B illustrate the data flow of the exemplary modules of FIG. 4 when arranged in tandem. FIG. 7A illustrates the data flow when the master 70 is data phase active and the dual 100 is in data phase slave state, meaning that the Write command has been received by the master. FIG. 7B illustrates the data flow when the master 70 is in data phase slave state and the dual 100 is data phase active, meaning that the command has been received by the dual.

One example of the data flow to the memory module (DRAM) 86 is by time slice multiplexing, mentioned above. In time slice multiplexing, the master data flow manager 77 assigns each of the tasks a time slice in which to write or read from the DRAM 86. The amount of data transferred in a given DRAM clock cycle is a direct function of the DRAM bandwidth, which for example may be assumed to be four bytes (32 bits) wide. Multiplexing in this way, it may be that there are 32 clocks for Data In (128 bytes), 32 clocks for Data Out, and 4 for Refresh before starting over. When operating in tandem with a dual module 100, there are times when the dual SCSI port 102 is requesting a Write (FIG. 7B), the data emerging from its compressor 110 and data block formatter must be written to DRAM 86. There may be two pins associated with the DRAM data path, +request (+REQ) and −acknowledge (−ACK). ACK is used to hold off the dual. When the master raises ACK, it relinquishes the bus to the dual. When the dual module 100 is active, FIG. 7B, and it has data ready for writing to the DRAM 86, the dual data flow manager 107 asserts +REQ, and the master data flow manager 77 holds off −ACK until the next Data In phase. With the next Data In phase, the master re-assumes control of the bus and begins the next phase. Depending on the relative clock phasing of the master and the dual, the arbitration in and out may require 1 to 2 clocks going in and 2 or 1 coming out, for a total of no more than 3 clocks. Thus, the Data In phase has been extended from the normal 32 clock cycles to 35 clock cycles.

The determination by the dual data flow manager 107 of which address space in which to write may be accomplished by various means, one of which is by microcode loading of the addresses.

While microcode can keep the two modules coordinated, a totally hardware method requires transmission of the address from one module to another. This can be done by latching the address bus or by passing across the data bus on a special cycle, extending the active state by one Data In phase. Another pin +Address would also have to be provided. On the special Data In phase, the next sequential address to be written can be supplied by the active, while the +Address is high. The +Address can then be dropped while the address bus is held constant so that the slave can latch the address in an asynchronous way on the falling edge of +Address.

If microcode is updating the base transfer address into the DRAM, as is conventional, copying it to the slave is trivial and keeps the two in tandem.

As illustrated in FIGS. 7A and 7B, the CRC checker and generator are the same circuits 78 and 108 used in different modes in the different modules. Similarly, the compressor/decompressor 80 and 110 are the same circuits in some embodiments. Arrows 190–195 denote the signal flow. The top arrows 190 and 191 in FIG. 7A from the active master data flow manager 77 to the DRAM 86 and to the slave indicates the direction of signal flow during the data into DRAM memory timeslice, and the lower arrow 192 indicates the direction during the out of DRAM timeslice. The top arrows 193 and 194 in FIG. 7B from the active dual data flow manager 107 to the DRAM 86 and to the slave (master) indicates the direction of signal flow during the data into DRAM memory timeslice, and the lower arrow 195 indicates the direction during the read out of DRAM timeslice. Again, the data is always supplied from the DRAM 86 to the master data flow circuits 87 for the attached device.

Figure 8:
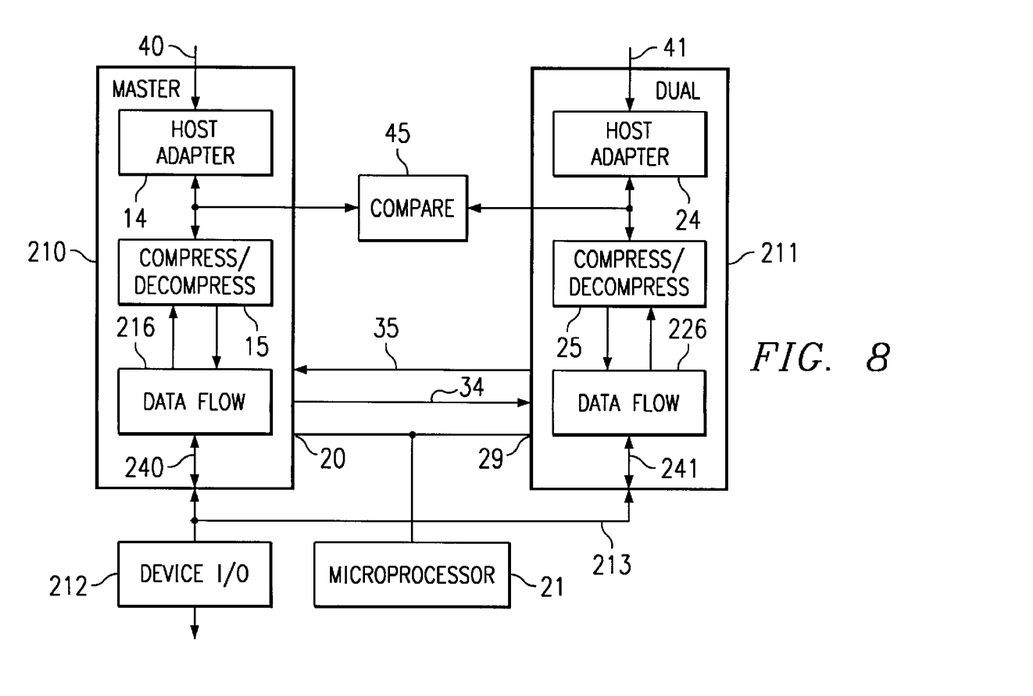
FIG. 8 is a block diagram of an alternative embodiment of input/output modules arranged in tandem in accordance with the present invention.

An alternative embodiment of the present invention is illustrated in FIG. 8, in which two compression modules 210 and 211 are arranged in tandem, with the data flow circuits and device I/O 212 tied together by data path 213 external to the modules. In master compression module 210, the data flow attachment is via data flow interface block 216, or data flow manager, and compressed data input/output interface bus 240. In dual compression module 211, the data flow attachment is via data flow interface block 226, or data flow manager, and compressed data input/output interface bus 241. The other components of the modules are the same as in FIG. 1. The data flow interface block does not perform all of the data management functions of data flow managers 16 and 26 of FIG. 1, which are not pertinent to the invention, but does monitor data flow path 213 in accordance with the invention.

The "active/slave" designation is also the same as with respect to FIG. 1. The module in the active state, 210 or 211, transfers data to the data flow circuits and device I/O 212 via interface bus 240 or 241, respectively. The module in the slave state, 211 or 210, monitors or "snoops" the compressed data transfer from the active state module at data path 213 and supplies the compressed data to the slave state compressor/decompressor 15 or 25. The functioning of the components numbered the same as in FIG. 1 is the same as described with respect to FIG. 1.

Also, other means of controlling the transfer of data between the data compression modules while allowing access to the data by the module in the slave state for decompressing data compressed by the module in the active state. For example, data may be written into a memory module by the active state module, accessed and read out by the slave state module, and separately accessed and read out by the module in the master mode to be supplied to the device I/O port. This process will work, but is less efficient than the monitoring or "snooping" process.

While the preferred embodiments of the present invention have been illustrated in detail, it should be apparent that modifications and adaptations to those embodiments may occur to one skilled in the art without departing from the scope of the present invention as set forth in the following claims.

We claim:

1. A data compression system for operating two data compression modules in tandem, comprising:
   a "master" data compression module having an uncompressed data input/output, a data compressor/decompressor, a data flow manager, and a compressed data input/output, said module operable to provide data compression/decompression between said data input/outputs;
   a "dual" data compression module having an uncompressed data input/output, a data compressor/decompressor, a data flow manager, and a compressed data input/output, said module operable to provide data compression/decompression between said data input/outputs;
   a data flow path coupling said master and said dual data compression modules; and
   a "tandem" control coupled to said master data compression module to cause said master data compression module to control said data flow path, and coupled to said dual data compression module to cause said dual data compression module to relinquish control of said data flow path.

2. The data compression system of claim 1, wherein said tandem control coupled to said master and to said dual data compression modules additionally idles said dual compressed data input/output, so that said master data flow manager transfers compressed data between said data compressor/decompressors and said master compressed data input/output.

3. The data compression system of claim 2, additionally comprising a dual port "active/slave state" control coupled to said uncompressed data input/outputs and to said data flow managers of said master and of said dual data compression modules, responsive to receipt of an input at one of said uncompressed data input/outputs to place said receiving data compression module in an active state, to idle said uncompressed data input/output of the one of said active state data compression modules (slave) not receiving said input, and to cause said data flow manager of said active state data compression module to provide data compression/decompression of data from said data inputs.

4. The data compression system of claim 3, wherein said tandem control comprises:
   a control line coupled to said master and to said dual data flow managers and to said master and to said dual compressed data input/outputs; and
   a master select signal source coupled to said control line for controlling said master and said dual data flow managers and said master and said dual compressed data input/outputs.

5. The data compression system of claim 3, wherein said active/slave state control comprises a microprocessor coupled to said uncompressed data input/outputs, and responsive to receipt of a command at one of said uncompressed data input/outputs to select the active state one of said data compression modules receiving said command, and to select the slave state one of said data compression modules not receiving said command.

6. The data compression system of claim 3, wherein said data flow path is coupled to transfer compressed data between said dual compressor/decompressor and said master compressed data input/output under the control of said master data flow manager to allow monitoring by said slave state data flow.

7. The data compression system of claim 3, additionally comprising an uncompressed data comparator coupled to said master and said dual data compressor/decompressors, and wherein said active/slave state control is additionally coupled to said data compressor/decompressors of said master and of said dual data compression modules, said active/slave state control additionally responsive to receipt of uncompressed input data at said active state uncompressed data input/output to cause said slave state data flow manager to monitor said compressed data at said data flow path and supplies said monitored compressed data to said slave state data compressor/decompressor to decompress said compressed data, and wherein said uncompressed data comparator compares said uncompressed data from said active state uncompressed data input/output to said decompressed data from said slave state data compressor/decompressor.

8. The data compression system of claim 7, wherein said uncompressed data comparator comprises:
   an error detector coupled to the decompressed data output of said slave state compressor/decompressor for detecting whether said data compression of said active state compressor/decompressor is correct.

9. The data compression system of claim 7, wherein said uncompressed data comparator comprises:
   a master CRC generator coupled to the uncompressed data input and the decompressed data output of said master compressor/decompressor for providing a CRC of said data;
   a dual CRC generator, identical to said master CRC generator, coupled to the uncompressed data input and the decompressed data output of said dual compressor/decompressor for providing a CRC of said data; and
   a CRC comparator coupled to said master and to said dual CRC generators for comparing said CRCs.

10. The data compression system of claim 7, wherein said uncompressed data comparator comprises:
    a first CRC generator coupled to the uncompressed data input of said compressor/decompressor, when in said active state, for providing a CRC of said uncompressed input data, and appending said CRC to said uncompressed input data;
    a second CRC generator, identical to said first CRC generator, coupled to the decompressed data output of said compressor/decompressor, when in said slave state, for providing a CRC of said decompressed data including said appended CRC, such that said result of said CRC generator comprises a zero if said decompressed data is identical to said uncompressed data; and
    a CRC checker coupled to said second CRC generator for detecting said result of said second CRC generator.

11. A data compression system for operating two data compression modules in tandem, comprising:
    a "master" data compression module having an uncompressed data input/output, a data compressor/decompressor, a data flow manager, and a compressed data input/output, said module operable to provide data compression/decompression between said data input/outputs;
    a "dual" data compression module having an uncompressed data input/output, a data compressor/ decompressor, a data flow manager, and a compressed data input/output, said module operable to provide data compression/decompression between said data input/outputs;

a data flow path coupling said master and said dual data compression modules;

an uncompressed data comparator coupled to said master data compression module data compressor/decompressor and coupled to said dual data compression module data compressor/decompressor; and a dual port "active/slave state" control coupled to said uncompressed data input/outputs and to said data flow managers of said master and of said dual data compression modules, and coupled to said data compressor/decompressors of said master and of said dual data compression modules, responsive to receipt of an input at one of said uncompressed data input/outputs to place said receiving data compression module in an active state, to idle said uncompressed data input/output of the one of said data compression modules (slave) not receiving said input, and said active/slave control causing said slave state data flow manager to monitor said compressed data from said active state compressor/decompressor at said data flow path to supply said compressed data to said slave state data compressor/decompressor to decompress said compressed data, said uncompressed data comparator comparing said uncompressed data from said active state uncompressed data input/output to said decompressed data from said slave state compressor/decompressor.

12. The data compression system of claim 11, wherein said uncompressed data comparator comprises, for each of said master and said dual data compression modules, an error detection generator coupled to said uncompressed data input for generating at least one error detection character from the uncompressed data of said uncompressed data input, and an error detector coupled to said decompressor of said data compressor/decompressor employing at least one error detection character received from said data compressor/decompressor for detecting whether the decompressed data of said data compressor/decompressor is correct; said active state error detection generator generates at least one error detection character from said uncompressed input data before compression; said slave state error detector employing said appended at least one error detection character for checking that said decompressed data is correct.

13. The data compression system of claim 12, wherein said uncompressed data comparator active state error detection generator appends said at least one error detection character to said uncompressed input data, and wherein said slave state error detector detects said at least one error detection character from said decompressed data for checking that said decompressed data is correct.

14. The data compression system of claim 13, wherein said active/slave state control comprises a microprocessor coupled to said uncompressed data input/outputs, and responsive to receipt of a command at one of said uncompressed data input/outputs to select the active state one of said data compression modules receiving said command, and to select the slave state one of said data compression modules not receiving said command.

15. The data compression system of claim 12, wherein said uncompressed data comparator active state error detection generator supplies said at least one error detection character to said slave state error detector, wherein said slave state error detection generator generates at least one error detection character from said decompressed data, and wherein said slave state error detector compares said at least one error detection characters from said uncompressed data and from said decompressed data.

16. The data compression system of claim 12, wherein said microprocessor active/slave state control checks said uncompressed data comparator slave state error detector for detection of an error.

17. A data compression system for operating two data compression modules in tandem, comprising:

a "master" data compression module having an uncompressed data input/output, a data compressor/decompressor, a data flow manager, and a compressed data input/output, said module operable to provide data compression/decompression between said data input/outputs, and a CRC generator coupled to said uncompressed data input and to said decompressor of said data compressor/decompressor and generating a CRC from the uncompressed data of said uncompressed data input or from the decompressed data of said data compressor/decompressor;

a "dual" data compression module having an uncompressed data input/output, a data compressor/decompressor, a data flow manager, and a compressed data input/output, said module operable to provide data compression/decompression between said data input/outputs, and a CRC generator coupled to said uncompressed data input and to said decompressor of said data compressor/decompressor for generating a CRC from the uncompressed data of said uncompressed data input or from the decompressed data of said data compressor/decompressor;

a data flow path coupled to said data flow managers of said master and of said dual data compression modules; and a dual port "active/slave state" control coupled to said uncompressed data input/outputs and to said data flow managers of said master and of said dual data compression modules, and coupled to said data compressor/decompressors of said master and of said dual data compression modules, responsive to receipt of an input at one of said uncompressed data input/outputs to place said receiving data compression module in an active state, to idle said uncompressed data input/output of the one of said data compression modules (slave) not receiving said input, said active state CRC generator generating a CRC of said uncompressed input data before compression, and said active/slave state control causing said slave state data flow manager to monitor said compressed data from said active state compressor/decompressor at said data flow path so that said slave state data compressor/decompressor decompresses said compressed data, said slave state CRC generator generating a CRC of said decompressed data, and said active/slave state control comparing said CRC from said active state CRC generator to said CRC from said slave state CRC generator.

18. The data compression system of claim 17, wherein said active state and said slave state CRC generators latch said CRCs and wherein said microprocessor active/slave state control detects and compares said CRCs.

19. The data compression system of claim 17, wherein said active state CRC generator appends said active CRC to said data for compression, and said slave state CRC generator generates said slave state CRC from said decompressed data including said appended CRC, such that said result of said CRC generator comprises a zero if said decompressed data is identical to said uncompressed data; and said microprocessor active/slave state control detects said result of said slave state CRC generator.

20. A data compression system for operating two data compression modules in tandem, comprising:

a "master" data compression module having an uncompressed data input/output, a data compressor/decompressor, a data flow manager, and a compressed data input/output, said module operable with a memory module coupled to said data flow manager to temporarily store compressed data in said memory module and to provide data compression/decompression between said data input/outputs;

a "dual" data compression module having an uncompressed data input/output, a data compressor/decompressor, a data flow manager, and a compressed data input/output, said module operable with a memory module coupled to said data flow manager to temporarily store compressed data in said memory module and to provide data compression/decompression between said data input/outputs;

a memory module having a data flow path coupled to said data flow managers of said master and of said dual data compression modules; and a "tandem" control coupled to said master data compression module data flow manager to cause said master data compression module data flow manager to control said memory module data flow path, and coupled to said dual data compression module data flow manager to cause said dual data compression module data flow manager to relinquish control of said memory module data flow path.

21. The data compression system of claim 20, wherein said tandem control is additionally coupled to said master and to said dual compressed data input/outputs and idles said dual compressed data input/output, so that said master compressed data input/output transfers compressed data between said memory module and said master compressed data input/output.

22. The data compression system of claim 21, additionally comprising a dual port "active/slave state" control coupled to said uncompressed data input/outputs and to said data flow managers of said master and of said dual data compression modules, responsive to receipt of an input at one of said uncompressed data input/outputs to place said receiving data compression module in an active state, to idle said uncompressed data input/output of the one of said data compression modules (slave) not receiving said input, and to cause said data flow manager of said active state data compression module to temporarily store compressed data in said memory module over said memory module data flow path under the control of said master to provide data compression/decompression of data from said data inputs.

23. The data compression system of claim 22, additionally comprising an uncompressed data comparator coupled to said master and said dual data compressor/decompressors, and wherein said active/slave state control is additionally coupled to said data compressor/decompressors of said master and of said dual data compression modules, said active/slave state control is additionally responsive to said receipt of uncompressed input data at said active uncompressed data input/output to cause said slave state data flow manager to monitor said compressed data from said active state compressor/decompressor at said data flow path so that said slave state data compressor/decompressor decompresses said compressed data, and wherein said uncompressed data comparator compares said uncompressed data from said active state uncompressed data input/output to said decompressed data from said slave state data compressor/decompressor.

24. The data compression system of claim 23, wherein said uncompressed data comparator comprises:

an error detector coupled to the decompressed data output of said slave state compressor/decompressor for detecting whether said data compression of said active state compressor/decompressor is correct.

25. The data compression system of claim 23, wherein said uncompressed data comparator comprises:

a master CRC generator coupled to the uncompressed data input and the decompressed data output of said master compressor/decompressor for providing a CRC of said data;

a dual CRC generator, identical to said master CRC generator, coupled to the uncompressed data input and the decompressed data output of said dual compressor/decompressor for providing a CRC of said data; and a CRC comparator coupled to said master and to said dual CRC generators for comparing said CRCs.

26. The data compression system of claim 23, wherein said tandem control comprises:

a control line coupled to said master and to said dual data flow managers and to said master and to said dual compressed data input/outputs; and a master select signal source coupled to said control line for controlling said master and said dual data flow managers and said master and said dual compressed data input/outputs.

27. The data compression system of claim 23, wherein said active/slave state control comprises a microprocessor coupled to said uncompressed data input/outputs, and responsive to receipt of a command at one of said uncompressed data input/outputs to select the active state one of said data compression modules receiving said command, and to select the slave state one of said data compression modules not receiving said command.

28. The data compression system of claim 23, wherein said slave state data flow manager monitors said memory module data path to retrieve said compressed data to supply said active state compressor/decompressor compressed data to said slave state compressor/decompressor.

* * * * *